United States Patent [19]

Ngo

[11] Patent Number: 5,334,284
[45] Date of Patent: Aug. 2, 1994

[54] SURFACE TREATMENT OF INDIUM PHOSPHIDE UTILIZING CHEMICAL ROUGHENING OF THE SURFACE

[75] Inventor: Catherine Ngo, Woodland Hills, Calif.

[73] Assignee: Hughes Aircraft Company, Los Angeles, Calif.

[21] Appl. No.: 134,129

[22] Filed: Oct. 12, 1993

Related U.S. Application Data

[63] Continuation of Ser. No. 996,232, Dec. 23, 1992, abandoned.

[51] Int. Cl.$^5$ ............................................. H01L 21/00
[52] U.S. Cl. ................................. 156/656; 252/79.2; 252/79.4; 156/651; 156/664
[58] Field of Search ............... 156/656, 650, 651, 664; 252/79.1, 79.2, 79.4

[56] References Cited

PUBLICATIONS

"Local Etching of Indium Phosphide In Anisotropic Etchants"; 1985; abstract only; Izv. Akad. Nauk SSSR, Neorg, Mater., 21(8).

"Investigations of Etched Channels on Indium Phosphide And Gallium Arsenide Substrates"; 1985; abstract only; Latv. PSR Zinat. Akad. Vestis, Fiz Teh. Zinat Ser. (5).

"Observation of Etch Pits Produced in InP By New Etchants", K. Akita, et al., pp. 783–787, *Journal of Crystal Growth* 46 (1979).

*Primary Examiner*—R. Bruce Breneman
*Assistant Examiner*—George Goudreau
*Attorney, Agent, or Firm*—V. D. Duraiswamy; W. K. Denson-Low

[57] ABSTRACT

A surface (30) of a wafer of indium phosphide (22) is treated by first etching the surface (30) with an aqueous solution of nitric acid and ceric ammonium nitrate. A toughening solution of about 4 parts by volume of acetic acid, about 4 parts by volume nitric acid, and about 1 part by volume hydrobromic acid is prepared and mixed. The roughening solution is contacted to the etched surface (30) of the wafer of indium phosphide (22) for about 15 to about 30 seconds to roughen the surface of the indium phosphide. Reaction products may be removed from the surface in aqueous hydrofluoric solution, and metal may be deposited upon the toughened surface in a strongly adhering layer (28).

16 Claims, 1 Drawing Sheet

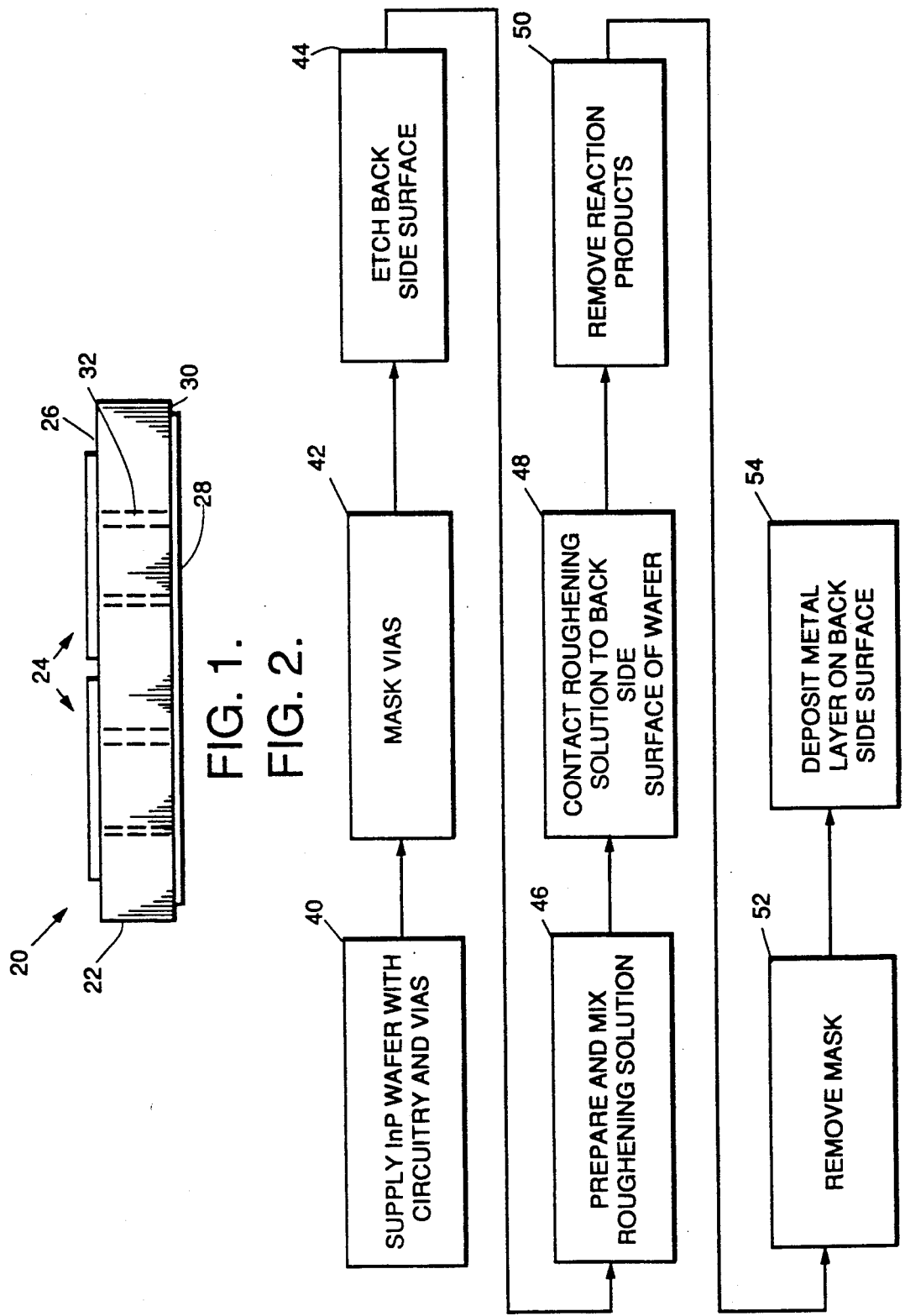

SURFACE TREATMENT OF INDIUM PHOSPHIDE UTILIZING CHEMICAL ROUGHENING OF THE SURFACE

This invention was made with Government support under Contract No. F19628-89-C-0176 awarded by the Department of the Air Force. The Government has certain rights in this invention.

This is a continuation of application Ser. No. 07/996,232 filed Dec. 23, 1992, now abandoned.

BACKGROUND OF THE INVENTION

This invention relates to the preparation of the surface of indium phosphide, and, more particularly, to such preparation including the chemical toughening of the surface.

In one approach to manufacturing a microelectronic device, electronic components are deposited upon the front side of a thin wafer of a substrate semiconductor material such as indium phosphide (InP). The wafer of indium phosphide is relatively thick, about 0.025 inches, at this deposition stage of the fabrication procedure. With the deposited electronic components in place on the front side of the wafer, the wafer is lapped from the back side to thin it to a final thickness of about 0.004 inches. Openings or vias are formed through the wafer from the back side to the electronic circuitry on the front side. A metallic layer is deposited upon the back side and patterned with external connection points and internal interconnects, and external connections are made to the metallic layer.

It is important that the metallic layer have good adhesion to the back side of the wafer, so that it will not separate and flake or peel away during service. If that were to happen, the microelectronic device might become inoperable. A problem arises because, during the fabrication process just described, the metallic layer must be deposited upon the back side surface that has just been lapped. Lapping is essentially a polishing process to remove the excess thickness of semiconductor material, and in the lapping process the back side of the wafer becomes very smooth and shiny. A deposited layer of metal does not adhere ("stick") well to such a smooth, shiny surface, and is prone to debonding during fabrication or service.

It is known that the metallic layer will have improved adherence to a somewhat rougher (i.e., less smooth) back side surface structure than that produced by the lapping operation. To improve the adhesion of the metallic layer to the back side of the semiconductor wafer, various mechanical roughening techniques have been tried. For example, sandblasting or sanding the lapped surface with coarse sandpaper can produce a controllably rough back side surface to which the metallic layer adheres well. However, these mechanical roughening techniques also damage the wafer by introducing surface imperfections such as fine microcracks into the back surface of the wafer. These imperfections can ultimately cause structural failure of the wafer initiated at the damaged surface during service.

A better approach to fabrication of these microelectronic devices utilizing metallic coating of the back side of a lapped semiconductor wafer is therefore required. Such an approach must be compatible with the presence of the electronic circuit elements on the front side, and must ensure good adherence of the metallic coating to the back side of the wafer. The present invention fulfills this need, and further provides related advantages.

SUMMARY OF THE INVENTION

The present invention provides a surface treatment approach for indium phosphide (InP) that may be utilized before subsequent deposition of an adherent metallic layer. The surface treatment of the invention is fully compatible with prior deposition of microelectronic circuitry on another surface of the indium phosphide piece. No surface damage is introduced during the present surface treatment.

In accordance with the invention, a process for preparing the surface of a piece of indium phosphide comprises the steps of supplying a piece of indium phosphide and etching a surface of the piece of indium phosphide with an aqueous solution of nitric acid and ceric ammonium nitrate. A toughening solution of acetic acid, nitric acid, and hydrobromic acid is prepared and contacted to the etched surface of the piece of indium phosphide for a contact time to roughen the surface of the indium phosphide. The reaction products may be removed with aqueous hydrofluoric acid solution, and a metallic layer deposited onto the toughened surface. The metallic layer adheres well to the chemically toughened surface, which is not damaged by the chemical toughening treatment.

In a preferred utilization of the invention, the piece of indium phosphide is a thin wafer that already has microelectronic circuitry deposited upon a front side thereof. The wafer has been thinned to the required final thickness, and vias have been formed through the wafer for electrical communication between the front side and the back side of the wafer. Photoresist is applied to the existing microelectronic circuitry and into the vias to protect them from damage in subsequent processing, and the procedure of the preceding paragraph is used to roughen the back side surface. The photoresist is removed. A metallic layer is deposited onto the back side surface and into the vias, and patterned as required for external and internal connections.

The toughening solution preferably has a composition of from about 4 to about 6 parts by volume of acetic acid (HCOOH), from about 4 to about 6 parts by volume of nitric acid (HNO$_3$), and about 1 part by volume of hydrobromic acid (HBr). A most preferred composition has about 4 parts by volume of acetic acid, about 4 parts by volume of nitric acid, and about 1 part by volume of hydrobromic acid. After combining these constituents, the solution is mixed for 10 minutes to initiate the reaction of the constituents. The indium phosphide piece is contacted to the solution briefly, preferably for 15 to 30 seconds, to achieve a regular and controlled surface toughening.

The present invention thus provides an improved approach for processing indium phosphide in an operation that requires the deposition of a metallic layer onto a surface of a polished piece of indium phosphide. Chemical toughening of the surface results in a regularly toughened surface that aids in achieving an adherent metallic coating. Other features and advantages of the present invention will be apparent from the following more detailed description of the preferred embodiment, taken in conjunction with the accompanying drawings, which illustrate, by way of example, the principles of the invention.

BRIEF DESCRIPTION OF THE DRAWINGS

FIG. 1 is an elevational view of an indium phosphide wafer substrate having a microelectronic device built thereon, with vias shown in phantom lines; and FIG. 2 is a block diagram of a process for preparing the structure of FIG. 1.

DETAILED DESCRIPTION OF THE INVENTION

FIG. 1 depicts a microelectronic device 20 built upon a wafer 22 of indium phosphide (InP). (The elements are not shown to scale.) The microelectronic device 20 is indicated schematically as having two microelectronic components 24 deposited upon a front side 26 of the wafer 22. A metallic layer 28 is deposited upon a back side 30 of the wafer 22. Vias 32 are formed as small openings through the thickness of the wafer 22, and extend from the microelectronic components 24 on the front side 26 to the metallic layer 88 on the back side 30. In an example of such a device 20, signal reception and/or signal processing are performed by the microelectronic components 24.

External electrical connections to the microelectronic components 24 are achieved through pads in the metallic layer 28. The metallic layer 28 and vias 32 may also provide electronic communication paths between the microelectronic components 24. To this end, the metallic layer 28 is usually patterned during or after deposition using conventional patterning techniques to produce connection pads and traces, but these features cannot be seen in the elevational view of FIG. 1. The precise nature of the microelectronic device 20 and patterning of the metallic layer 28 are not a part of the present invention, which is operable with any such structure.

FIG. 2 depicts the procedure for preparing the microelectronic device 20 of FIG. 1. In an initial step, numeral 40, an indium phosphide piece is provided. The indium phosphide piece is preferably an oriented polycrystal with a cubic [001] direction of each grain perpendicular to the front side 26 and the back side 30. Such a piece may be cut from a larger directionally solidified Ingot of the indium phosphide material. The indium phosphide piece is typically a relatively thin disk having a diameter of about 2–3 inches and a thickness of about 0.025 inches. The indium phosphide piece is normally supplied much thicker than the final thickness of the wafer 22, to permit handling and deposition without fracture. The microelectronic components 24 are deposited on the front side 26 and the vias 32 are formed through the piece using known, conventional techniques appropriate for the particular components and vias being fabricated.

The indium phosphide piece is next thinned to its final thickness from the back side 30 by lapping. In lapping, the indium phosphide piece is thinned by polishing the back side on a polishing wheel to slowly and uniformly remove material. (No material is removed from the front side, inasmuch as the microelectronic components are already in place on the front side.) In the preferred approach, the piece of indium phosphide is thinned to a thickness of about 0.004 inches by lapping. The details of this step 40 depend upon the exact nature of the microelectronic device 20, and are known in the art for each such device 20.

The lapping operation to thin the indium phosphide piece to the desired final thickness of the wafer 22 leaves the back side 30 very smooth and polished. A later-deposited metallic layer will not adhere well to such a smooth, polished surface. The chemical treatment of the present invention roughens the surface of the back side 30 slightly without damaging the front side 26, the microelectronic components 24 on the front side, or the vias 32. A subsequently deposited metallic layer adheres well to this chemically toughened back side surface 30.

To accomplish the chemical roughening, the vias 32 are first masked, numeral 42, to prevent their damage (enlargement) by contact with the etching and chemical toughening solutions and to prevent the roughening solutions from penetrating through the vias to the microelectronic components 24 to damage them. The masking is preferably accomplished using any type of thick commercial photoresist, such as, For example, Shipley 4620. The indium phosphide piece is mounted with its front side 20 facing downwardly on a larger silicon piece. (The front side 26 and the microelectronic components 24 are thereby protected against subsequent attack in the etching and roughening solutions.) The silicon piece is placed on a spinner and the liquid photoresist is applied to the upwardly facing back side surface 30. The spinner is rotated at about 1000 revolutions per minute for about 30 seconds to spread the photoresist over the back side surface 30 and into the vias 32. Excess photoresist is spun away. The photoresist is next hardened according to the instructions for that particular type of photoresist. In a typical case the wafer and photoresist are baked for 10 minutes at 75C–90C, flood exposed with light or other radiation with the recommended dosage for the selected type of photoresist, and developed using the recommended developing procedure for the selected photoresist material. The developed wafer structure is rinsed in deionized water and dried with nitrogen. The finished photoresist-protected wafer is inspected carefully to verify full coverage and penetration into the vias. If any flaws in the photoresist coating of the vias are found, they are touched up with photoresist material. These steps are usually repeated two more times to ensure that all vias are filled with the thick photoresist material.

The unmasked back side 90 of the wafer 22 is contacted with an etching solution, numeral 44. The etchant preferably is an aqueous solution of nitric acid and ceric ammonium nitrate $(Ce(NH_4)_2(NO_3)_6)$. The etching solution preferably has a composition of about 10–20 (most preferably, 12) percent by weight of nitric acid, about 10–20 (most preferably, 10) percent by weight of ceric ammonium nitrate, and the balance of water. Such an etchant is available commercially from KTI Chemicals as Chrome Etch. The back side 30 is contacted to the etching solution for about 5–15 minutes at ambient temperature. This etchant solution pits the back side surface 30 slightly, but does not produce the desired degree of surface roughening.

The roughening solution is prepared and mixed, numeral 46. The preferred roughening solution has a composition of from about 4 to about 6 parts by volume of acetic acid, and about 4 to about 6 parts by volume nitric acid, and about 1 part by volume hydrobromic acid. The selected composition achieves a balancing between strength and rate of attack. If the solution has less than about 4 parts of acetic acid and 4 parts of nitric acid, it too strong and attacks the indium phosphide and even the photoresist masking material at too high a rate. If the solution has more than about 6 parts of acetic acid and 6 parts nitric acid, its rate slows and becomes uneconomic and eventually ineffective. A most preferred roughening solution has about 4 parts by volume of acetic acid, about 4 parts by volume of nitric acid, and about 1 part by volume of hydrobromic acid.

After the constituents of the roughening solution are combined, the solution is preferably stirred for 10 minutes under an exhaust hood to react the constituents together to produce bromine and nitrogen oxide.

The roughening solution is contacted to the back side surface 30 of the wafer 22, preferably by immersing the wafer into the solution at ambient temperature numeral 48. Exposure is for from about 15 to about 30 seconds, but in any case should not exceed 30 seconds because the photoresist and the underlying protected structure may be attacked by longer exposure.

After exposure, the wafer is removed from the roughening solution and cleaned to remove the reaction products, numeral 50. The surface is first washed in deionized water to remove the solution, and dried in nitrogen. The resulting exposed back side surface 30 of the wafer 22 is gray-black in color due to indium oxide residue from the reaction with the roughening solution. The residue can be removed by immersing the wafer in aqueous hydrofluoric acid solution, preferably 7 parts by volume water and 1part by volume hydrofluoric acid, for 10-15 seconds. The surface is again washed in deionized water and dried in nitrogen.

The resulting back side 30 has a surface that is controllably roughened to a roughness of about 2-3 micrometers. When viewed at 100X magnification, the indium phosphide back side 30 has a pebbled, grainy appearance. When the procedure is performed as set forth herein, the vias 82, front side 26, and microelectronic components 24 are not attacked or damaged in any manner.

The photoresist mask of the vias is removed, numeral 52. The photoresist can be removed by immersing the wafer in a suitable solvent for the photoresist material. In the usual case, a suitable solvent is acetone.

The metallic layer 28 is deposited onto the back side 30 by any suitable process, such as electron beam evaporation or sputtering, numeral 54. The metal is typically titanium, platinum, or gold in a thickness of about 10,000 Angstroms. The metallic layer 28 can be deposited in a patterned form, or deposited as a uniform layer and subsequently patterned by conventional techniques.

EXAMPLE

Several hundred microelectronic devices with indium phosphide wafer substrates were prepared using the preferred approach Just described. The metallic layers 28 were found to be strongly adhered to the back side surfaces 80 in each case. Attempts were made to remove the metallic layers with adhesive tape, but these attempts were unsuccessful.

The present invention provides an approach for treating indium phosphide surfaces, Including surface toughening to improve the adherence of metallic coatings on the indium phosphide. Although a particular embodiment of the invention has been described in detail for purposes of illustration, various modifications may be made without departing from the spirit and scope of the invention. Accordingly, the invention is not to be limited except as by the appended claims.

What is claimed is:

1. A process for preparing the surface of a piece of Indium phosphide, comprising the steps of:

supplying a piece of indium phosphide;
    etching a surface of the piece of indium phosphide with an aqueous solution of nitric acid and ceric ammonium nitrate;
    preparing and mixing a roughening solution of acetic acid, nitric acid, and hydrobromic acid; and
    contacting the roughening solution to the etched surface of the piece of indium phosphide for a contact time sufficient to roughen the surface of the indium phosphide.

2. The process of claim 1, wherein the piece of indium phosphide is a directionally oriented polycrystal.

3. The process of claim 1, wherein the contact time of the InP with the roughening solution is less than 30 seconds.

4. The process of claim 1, wherein the contact time of the InP with the roughening solution is from about 15 to about 30 seconds.

5. The process of claim 1, including the additional step, after the step of contacting with the roughening solution, of removing reaction products from the surface of the piece of indium phosphide.

6. The process of claim 5, wherein the step of removing is performed by contacting aqueous hydrofluoric acid solution to the surface of the piece of indium phosphide.

7. The process of claim 1, including the additional step, after the step of contacting the InP with the roughening solution, of depositing metal on the toughened surface of the piece of indium phosphide.

8. The process of claim 1, wherein the roughening solution has from about 4 to about 6 parts by volume of acetic acid, from about 4 to about 6 parts by volume of nitric acid, and about 1 part by volume of hydrobromic acid.

9. A process for preparing the surface of a piece of indium phosphide, comprising the steps of:

supplying a piece of indium phosphide;
    etching a surface of the piece of indium phosphide with an aqueous solution of nitric acid and ceric ammonium nitrate;
    preparing and mixing a toughening solution of about 4 parts by volume of acetic acid, about 4 parts by volume nitric acid, and about 1 part by volume hydrobromic acid; and
    contacting the toughening solution to the etched surface of the piece of indium phosphide for from about 15 to about 30 seconds to roughen the surface of the indium phosphide.

10. The process of claim 9, wherein the piece of indium phosphide is a directionally oriented polycrystal.

11. The process of claim 9, including the additional step, after the step of contacting with the roughening solution, of removing reaction products from the surface of the piece of indium phosphide.

12. The process of claim 11, wherein the step of removing is performed by contacting aqueous hydrofluoric acid solution to the surface of the piece of indium phosphide.

13. The process of claim 9, including the additional step, after the step of contacting with the roughening solution, of depositing metal on the toughened surface the piece of indium phosphide.

14. A process for preparing the surface of a piece of indium phosphide, comprising the steps of:

supplying a wafer of indium phosphide having microelectronic circuitry deposited on a front side surface thereof and vias formed therethrough;

masking the vias of the wafer and protecting the front side and microelectronic circuitry from attack;

etching a back side surface of the piece of indium phosphide with an aqueous solution of nitric acid and ceric ammonium nitrate;

preparing and mixing a toughening solution of about 4 parts by volume of acetic acid, about 4 parts by volume nitric acid, and about 1 part by volume hydrobromic acid;

contacting the toughening solution to the etched back side surface of the piece of indium phosphide for from about 15 to about 30 seconds to roughen the back side surface of the wafer;

contacting aqueous hydrofluoric acid solution to the back side surface of the wafer to remove reaction products from the back side surface;

removing the mask; and depositing metal on the back side surface of the wafer.

15. The process of claim 14, wherein the step of masking includes the steps of applying a photoresist material to the back side surface of the wafer, spreading the applied photoresist material to form a layer over the back side surface of the wafer, and exposing the photoresist material to radiation to harden the photoresist material, and developing the photoresist material.

16. The process of claim 14, wherein the solution of nitric acid and eerie ammonium nitrate has a composition of from about 10 to about 20 percent by weight of nitric acid, from about 10 to about 20 percent by weight ceric ammonium nitrate, and the balance of the solution being water.

* * * * *